United States Patent [19]
Nguyen et al.

[11] Patent Number: 6,001,699
[45] Date of Patent: *Dec. 14, 1999

[54] HIGHLY SELECTIVE ETCH PROCESS FOR SUBMICRON CONTACTS

[75] Inventors: Phi L. Nguyen, Hillsboro; Mark A. Fradkin, Portland; Gilroy J. Vandentop, Aloha, all of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/589,903

[22] Filed: Jan. 23, 1996

[51] Int. Cl.⁶ .................................................. C03C 15/00
[52] U.S. Cl. .................. 438/305; 438/700; 438/729; 438/743
[58] Field of Search .................. 216/84, 59, 67; 438/723, 714, 702, 637, 305, 700, 729, 743; 252/79.1

[56] References Cited

U.S. PATENT DOCUMENTS

| | | | |
|---|---|---|---|
| 5,021,121 | 6/1991 | Groechel et al. | 156/643 |
| 5,284,549 | 2/1994 | Barnes et al. | 156/662 |
| 5,286,344 | 2/1994 | Blalock et al. | 156/657 |
| 5,607,879 | 3/1997 | Wuu et al. | 437/193 |

FOREIGN PATENT DOCUMENTS 0 655 775  5/1995  European Pat. Off. .

OTHER PUBLICATIONS

*Solid State Technology*, Penwell Publishing Co., vol. 38, No. 12, Dec. '95, p. 108.

*Primary Examiner*—Donna C. Wortman
*Assistant Examiner*—Brenda G. Brumback
*Attorney, Agent, or Firm*—Blakely, Sokoloff, Taylor & Zafman

[57] ABSTRACT

A method for forming contacts with vertical sidewalls, high aspect ratios, improved salicide and photoresist etch selectivity at submicron dimensions. In one currently preferred embodiment, an opening is formed in a dual oxide layer by etching the undoped oxide layer at a first rate and then etching the doped oxide layer at a second rate. The etch process is performed in a low density parallel plate reactor. The process parameters of the etch are fixed in ranges which optimize the etch process and allow greater control over the critical dimensions of the opening. For example, the oxide layer is etched at a pressure in the range of approximately 100–300 mTorr and with an etch chemistry having a $CHF_3:CF_4$ gas flow ratio in the range of approximately 3:1–1:1, respectively.

19 Claims, 5 Drawing Sheets

HIGHLY SELECTIVE ETCH PROCESS FOR SUBMICRON CONTACTS

BACKGROUND OF THE INVENTION

1. Field of the Invention

This invention relates to the field of semiconductor devices, and more specifically, to a process for forming contacts with vertical sidewalls, improved salicide and photoresist selectivity, and submicron dimensions.

2. Background Information

As semiconductor devices shrink ever smaller, so must the circuitry (components) such as contacts, plugs, vias, and interconnect lines. For example, in the current generation of semiconductor devices, the density of the circuitry (components) has become so compact that the dimensions of these components have decreased below submicron dimensions (<1 micron).

A consequence of the smaller devices and the increasing density of the components on these devices is that it becomes increasingly more important to control the critical dimensions of these components. As the dimensions for these components become even smaller and spaced relatively closer, for example, less than 0.5 micron (<0.5$\mu$) and even less than 0.25 micron (<0.25$\mu$), the processes used to make such components become less reliable and are unable to control the critical dimensions (CDs) of such components. If the critical dimensions of such components are not controlled, some of the components may be shorted together and consequently the semiconductor device being fabricated may not function properly.

In order to control the critical dimensions of these components, the processes used to manufacture these components should have good etch selectivity (to salicides, photoresists, metals, etc.) and high aspect ratios. Prior art processes have the ability to control the critical dimensions within acceptable tolerance ranges for components with dimensions in the range of approximately 0.5–1.0 micron ($\mu$). However, as the dimensions decrease below this level, and especially at or below 0.25$\mu$, these processes do not provide sufficient control over the critical dimensions due to poor etch selectivity and low aspect ratios. Etch selectivity is the ratio of the etch rates of different materials. For example, the etch selectivity for forming a contact may be the ratio of the etch rate of an oxide layer to that of a salicide layer (i.e. oxide: salicide). Aspect ratio is the depth that an etch process can achieve while maintaining the requisite critical dimensions. For example, when forming a contact an etch process with too low an aspect ratio may form the contact too shallow such that the contact may not reach the underlying salicide or polysilicon layer.

FIGS. 1a–1c illustrate the generic (or well known) process steps for photolithographic and masking techniques used to form contacts. It should be noted that the Figures are merely illustrative and have been simplified for clarity purposes and that similar processes may be used to form more complex structures as will be illustrated in later figures. FIG. 1a illustrates a substrate 100 with an oxide layer 110 deposited thereon. In FIG. 1b, a photoresist layer 120 has been spun above oxide layer 110 and is exposed to light through mask layer 130. After photoresist layer 120 has been exposed to light, mask layer 130 is removed and photoresist layer 120 is developed in a developing solution to remove the portions of photoresist layer 120 that were not exposed to light. FIG. 1c illustrates photoresist layer 120 after the soluble portions of photoresist layer 120 have been removed. It should be noted that although the above description describes positive resist techniques, it will be obvious to one with ordinary skill in the art, that negative resist techniques may also be used to form contacts.

Once the soluble portions of photoresist layer 120 have been removed, oxide layer 110 is then etched to form an opening 140, in order to create a contact. The particular etch chemistry and process parameters used not only determine the amount of control over the critical dimensions such as width and length, but also control the aspect ratio and etch selectivity (to salicides, photoresists, metals, etc.) of the contact.

As illustrated in FIG. 1d, prior art processes are unable to control the critical dimensions of opening 140. The sidewalls of opening 140, as shown in FIG. 1d, are not vertical and slope outward at the top of the opening. For packing densities it is ideal to form an opening with vertical sidewalls, i.e. sidewalls with a slope of 90°, while keeping the final CD the same as the printed CD. However, typical prior art etch processes only have the ability to form sidewalls with a slope of approximately 85–86°, while keeping the final CD the same as the printed CD. Some prior art processes that produce near 90° slope, have final CDs larger than the printed CDs because they give up photoresist selectively to gain the near 90° slope. As illustrated in FIG. 1b, the masks 130 are the same width as the space between the masks, such that the openings 140 (illustrated in FIG. 1d) should be the same width as the spaces in between the openings. For example, openings printed with a width of 0.32$\mu$ and spaced 0.32$\mu$ apart should form openings with a width of 0.32$\mu$ and spaced 0.32$\mu$ apart. However, due to poor photoresist selectivity, the width of the openings are larger than the masks 130 and consequently the spaces between the openings are smaller. In the example given above for openings printed at 0.32$\mu$ and spaced at 0.32$\mu$, using prior art processes the openings may be formed with a width of approximately 0.40$\mu$ and spaced approximately 0.24$\mu$ apart.

Vertical sidewalls and adequate space between openings help to maintain the electrical characteristics of the device. Control over the vertical sidewalls as well as the width of the components allow the formation of such components closer to one another without shorting the components together. Thus, as the density of such components on a device increase such changes in the width and the slope of the sidewalls of the opening cannot be tolerated.

Other problems with prior art processes for forming contacts that may affect the electrical performance of a device are illustrated in FIG. 2a. For example, as shown in FIG. 2a, prior art processes not only have problems with the slope of the sidewalls and large opening widths, but also have low aspect ratios. The aspect ratio is the depth that an etch process can achieve while maintaining the requisite critical dimensions. In this case, the aspect ratio is defined as the contact depth divided by the contact opening. As illustrated in FIG. 2a, opening 260 has a high enough aspect ratio to form a contact with salicide layer 230 above gate electrode 220. However, opening 270 has too low an aspect ratio to form a contact with salicide layer 230 above source/drain region 211. Therefore, the electrical connection to source/drain region 211 is never made and the device is defective. This aspect ratio problem is also known as "etch stopping."

Etch stopping, or low aspect ratio, is a phenomena wherein the etch chemistry used to etch the opening form polymer deposits. The build-up of these polymer deposits may degrade the etch process. The amount of polymer formed is a function of the etch time. Thus, the greater the etch time the greater the amount of polymer that is formed.

Eventually, the amount of polymer formed may stop or slow the etch process such that the opening being etched may not be formed deep enough. Also, as more and more wafers are etched in a process chamber, for example, in a parallel plate reactor, the greater the build-up of polymer deposits. After a certain amount of time (or after processing a certain number of wafers, for example 400–1000 wafers) the process chamber must be cleaned to remove the polymer deposits such that the etch step may continue in a reliable and efficient manner. Stopping to clean the process chamber takes time and consequently decreases the throughput of the system.

Another problem with prior art processes is also illustrated in FIG. 2a. In addition to the problems with the slope of the sidewalls, large opening widths, and low aspect ratios, prior art processes may also have problems with salicide selectivity. During the etch process used to form opening 260 as shown in FIG. 2a, the etch did not stop on salicide layer 230 and actually punched through the salicide layer to the underlying gate electrode 220. Punchthrough of the salicide layer may degrade the electrical performance of the device. Salicide punchthrough is especially prevalent when prior art processes sacrifice photoresist selectivity to achieve vertical slopes and high aspect ratios.

Some prior art processes utilize "etch stops" to compensate for the poor selectivity of the etch (e.g. etch selectivity for salicides). Etch stops are an additional layer that may be added between for example, a salicide layer and an oxide layer that is made of a material that has a slower etch rate than that of the oxide or salicide. It should be noted and it will be obvious to one with ordinary skill in the art that etch stops may be used between any number of materials and the example of oxide and salicide layers given above is merely illustrative. The use of etch stops require the addition of an extra processing layer above the salicide layer and consequently require additional processing steps. It should be noted that anytime additional processing steps are added, the probability for processing errors during fabrication increases and so to does the cost of the fabrication process.

Thus, what is needed is a method for forming contacts with vertical sidewalls, improved etch selectivity, and submicron dimensions, such that smaller and more dense semiconductor devices may be fabricated and still exhibit good electrical performance. It is also preferable that this method does not require an etch stop layer as to reduce the cost of semiconductor device manufacturing.

SUMMARY OF THE INVENTION

The present invention describes a method for forming contacts with vertical sidewalls, improved etch selectivity, and submicron dimensions. One preferred embodiment of the present invention forms an opening in a dual oxide layer by etching the undoped oxide layer at a first rate and then etching the doped oxide layer at a second rate. The etch process is performed in a low density parallel plate reactor. The process parameters of the etch are fixed in ranges which optimize the etch process and allow greater control over the critical dimensions of the opening. For example, the oxide layer is etched at a pressure in the range of approximately 100–300 mTorr and with a $CHF_3:CF_4$ gas flow ratio in the range of approximately 3:1–1:1, respectively.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A highly selective etch process for submicron contacts is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for forming contacts with vertical sidewalls, improved salicide and photoresist etch selectivity, and submicron dimensions without the use of etch stops. In the manufacture of semiconductor devices and more specifically when forming contacts, the present invention is employed to control the critical dimensions of the opening thus allowing the openings to be spaced relatively close together without degrading the electrical performance of the semiconductor device.

Figure 1A:
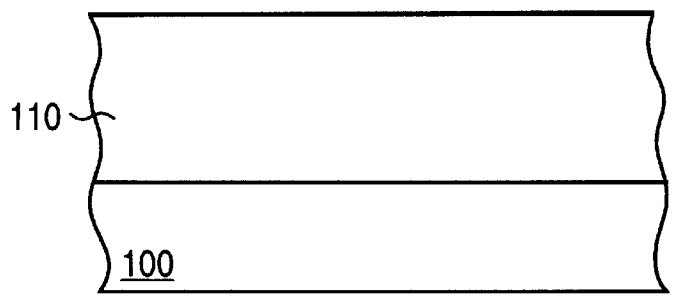
FIG. 1a illustrates a cross-sectional view of a substrate with an oxide layer deposited thereon.
Figure 1B:
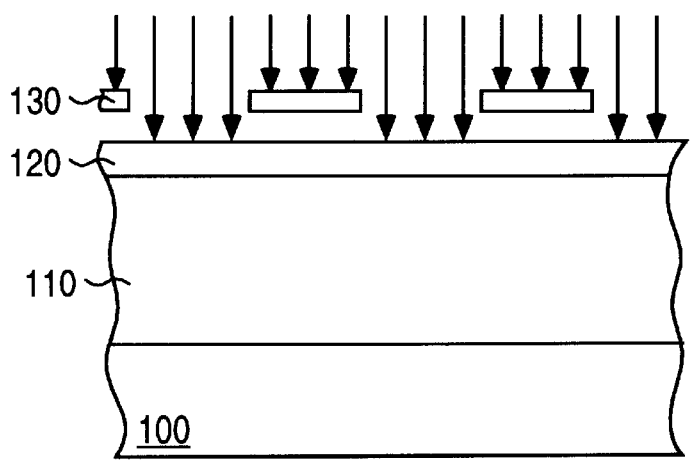
FIG. 1b illustrates a cross-sectional view of a mask and a photoresist layer coated on the oxide layer of FIG. 1a during exposure to light.
Figure 1C:
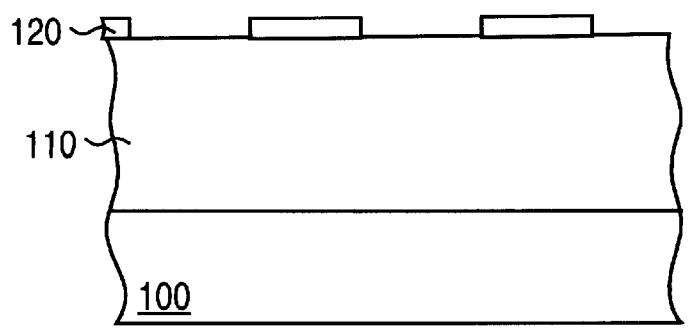
FIG. 1c illustrates a cross-sectional view of the photoresist layer of FIG. 1b after patterning.

When forming a semiconductor device, for example, an integrated circuit, a source region and a drain region are formed in a semiconductor substrate and a gate electrode is formed above the substrate between the source and drain regions. A salicide layer may be grown above the source region, drain region, and gate electrode. An oxide layer is then deposited above the salicide layers to insulate the integrated circuit from other device layers formed above the integrated circuit. However, it is generally necessary to interconnect the integrated circuit at the source region, drain region, gate electrode, or any combination thereof to other devices or metal layers of the semiconductor device. In order to make such electrical connections, a contact is formed by etching an opening in the oxide layer. The opening in the oxide layer is etched above the region of the integrated circuit to be connected and then the opening is filled with a metal or metal alloy. It should be noted, and it will be obvious to one with ordinary skill in the art, that the photolithographic and masking steps used to form a contact are well known in the art and are therefore not described in detail. A general example of such processes has been discussed above in the background of the invention and is illustrated in FIGS. 1a–1c. It should also be noted that the photolithographic processes and masking steps, as illustrated in FIGS. 1a–1c, are used with respect to the present invention but are not repeated or shown in FIGS. 2a–2c.

Figure 1D:
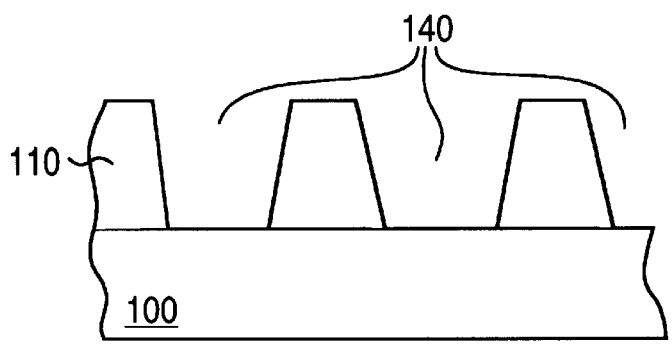
FIG. 1d illustrates a cross-sectional view of the oxide layer of FIG. 1c after etching using prior art etch processes.
Figure 1E:
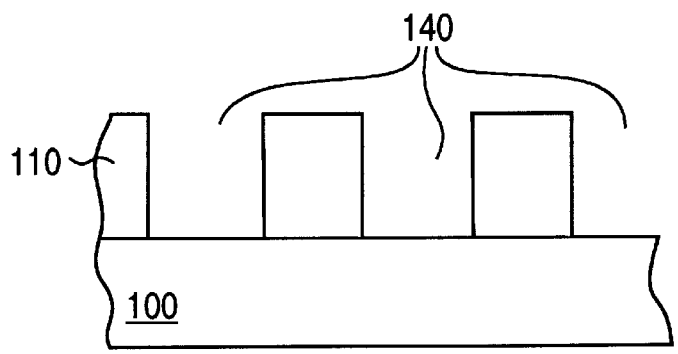
FIG. 1e illustrates a cross-sectional view of the oxide layer of FIG. 1c after etching using a preferred embodiment of the present invention.

The formation of contacts with vertical sidewalls, improved salicide and photoresist etch selectivity, and sub-micron dimensions requires an improved etch process/recipe for etching the oxide layer to form the openings. FIG. 1e illustrates a cross-sectional view of the oxide layer of FIG. 1c after etching using a preferred embodiment of the present invention. Referring above to the example discussed in the background of the invention, wherein the openings were printed with a width of 0.32$\mu$ and spaced 0.32$\mu$ apart, the use of prior art etch recipes formed the openings, as illustrated in FIG. 1d, with a width of approximately 0.40$\mu$ and spaced approximately 0.24$\mu$ apart. However, in the same example using the etch recipe of the present invention formed the openings with a width of approximately 0.32$\mu$ and spaced approximately 0.32$\mu$ apart, as shown in FIG. 1e.

Figure 3:
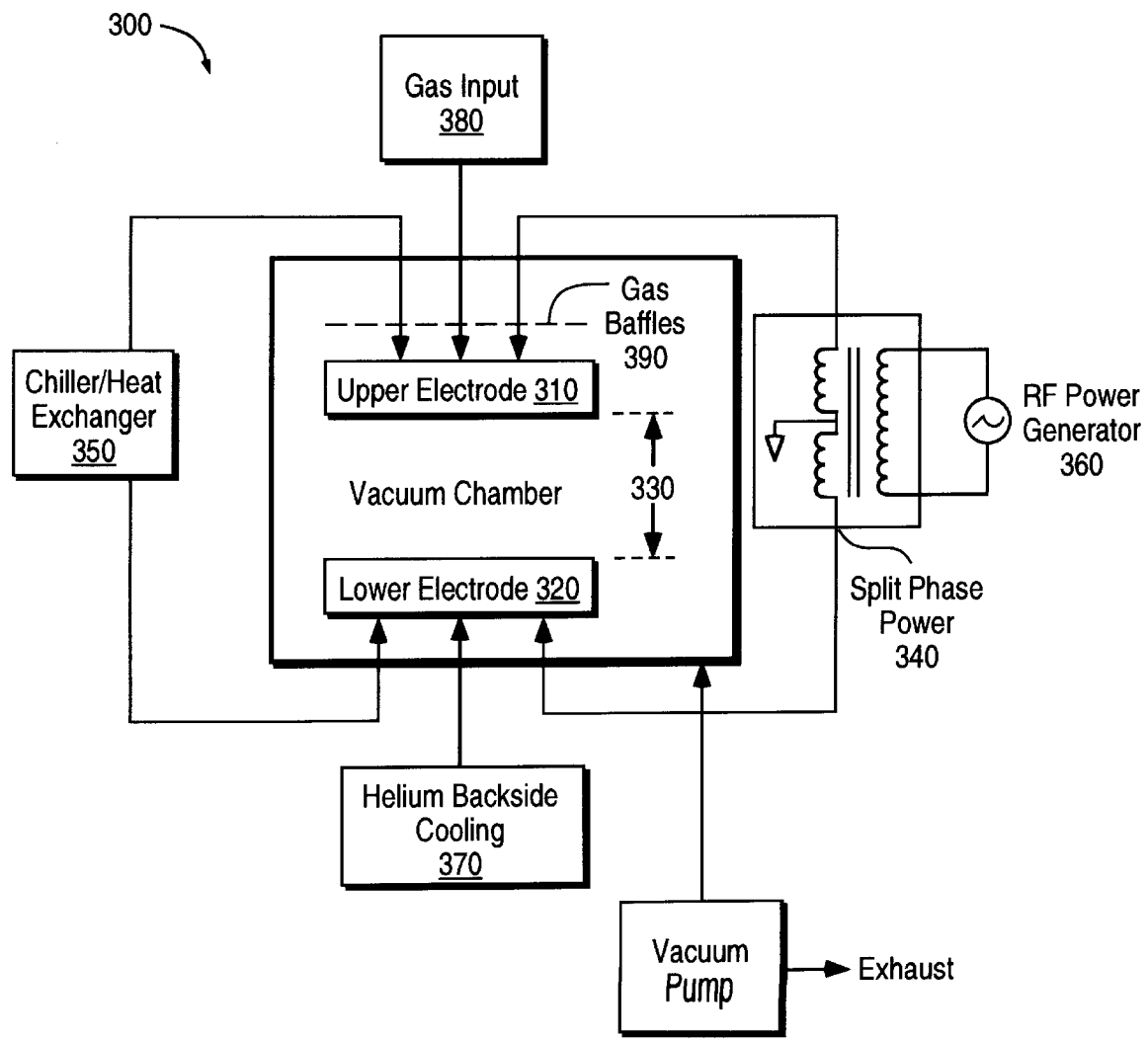
FIG. 3 illustrates a schematic of one embodiment of a low density parallel plate etch reactor.

The present invention performs an oxide layer etch in a low density parallel plate etch reactor. One example of such a reactor is the Rainbow 4528 Oxide Etcher (Rainbow 4528) available from LAM Research Corporation, in San Jose, Calif., and is illustrated in FIG. 3. Although the present invention is described below with reference to the Rainbow 4528 (reactor 300) it will be obvious to one with ordinary skill in the art that the present invention may be practiced using other similar reactors. Prior art etch recipes used in conjunction with reactor 300 may have been sufficient for forming contacts with dimensions in the range of approximately 0.5–1.0$\mu$, however, are no longer sufficient for forming contacts with dimensions below 0.5$\mu$, and especially at or below 0.25$\mu$, for current and next generation chip densities.

In one embodiment of the present invention the power of the reactor is split evenly between the upper electrode 310 and lower electrode 320. Additionally, the RF power signal at each electrode is 180 degrees out of phase with respect to one another. Upper electrode 310 and lower electrode 320 operate in the present invention with a gap spacing 330 in the range of approximately 1–1.2 cm. Because reactor 300 operates with split phase power 340, the oxide layer is etched with a forward power of approximately 1000–1800 watts and a reflected power of less than 10 watts. The electrode temperatures are maintained at a temperature in the range of approximately 0.1–20° C. while etching the oxide layer using chiller/heat exchanger 350. RF power generator 360 operates at an RF frequency of approximately 400 kHz.

In the present invention, the oxide layer is etched at a pressure in the range of approximately 100–300 mTorr with a helium backside cooling (370) pressure in the range of approximately 10–20 Torr. It should be noted that helium backside cooling is a process for cooling the backside of a wafer (or substrate) wherein helium is pumped into the gap between the wafer and lower electrode 320, thus cooling the backside of the water. The etch chemistry of the present invention is delivered to the reactor through gas input 380 and gas baffles 390. Nitrogen gas and argon gas are delivered at a gas flow in the range of approximately 20–100 sccm and 300–500 sccm, respectively. The oxide layer is etched with $CHF_3$ and $CF_4$ gases which are delivered to the reactor at a $CHF_3:CF_4$ gas flow ratio in the range of approximately 3:1–1:1, respectively.

Figure 2A:
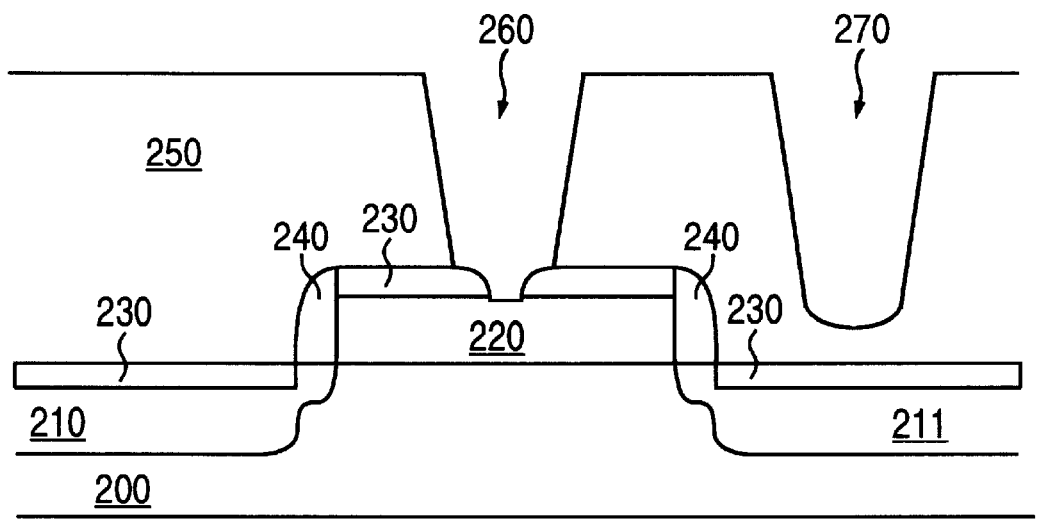
FIG. 2a illustrates a cross-sectional view of a contact formed with the gate electrode and source region of a semiconductor device using prior art etch processes.
Figure 2B:
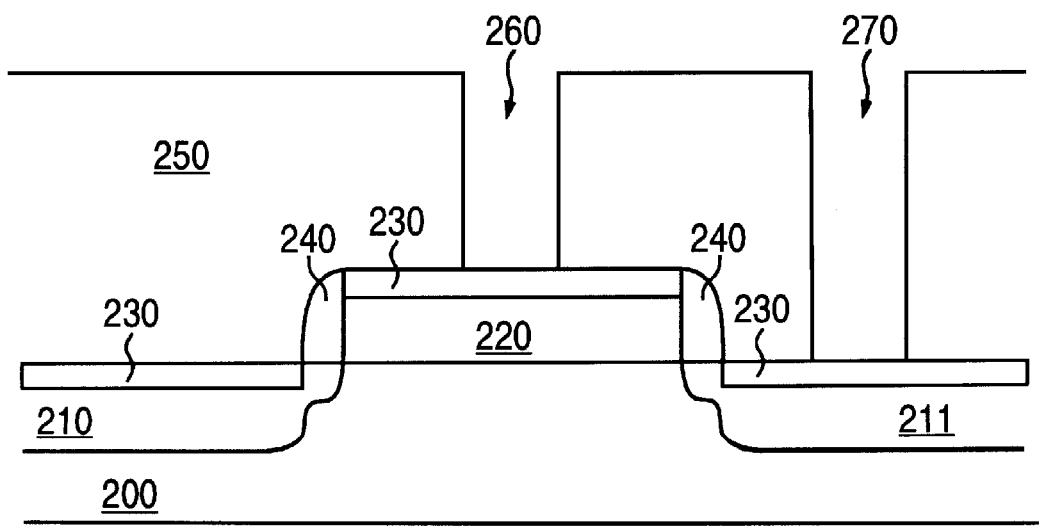
FIG. 2b illustrates a cross-sectional view of a contact formed with the gate electrode and source region of a semiconductor device using one preferred embodiment of the present invention.

FIG. 2b illustrates the semiconductor device as shown in FIG. 2a, with the exception that contacts 260 and 270 have been formed using the etch process of one embodiment of the present invention. Gate electrode 220 is formed above substrate 200. Source region 211 and drain region 210 are formed in substrate 200 on opposite sides of gate electrode 220. Salicide layers 230 are formed above gate electrode 220, source region 211, and drain region 210, respectively. Sidewall spacers 240 are formed on each side of gate electrode 220. Oxide layer 250 has been formed above salicide layers 230 and sidewall spacers 240. Openings 260 and 270 are etched in oxide layer 250 above gate electrode 220 and source region 211, respectively, using the etch process of the present invention. It should be noted that the length (or time period) of the etch process may vary depending upon the thickness of oxide layer 250. It should also be noted that oxide layer 250 may be a doped oxide or an undoped oxide layer and that the etch rate of the present invention may vary depending upon the type of oxide layer used (i.e. whether a doped or undoped oxide layer is used), as is described in greater detail in the discussion of FIG. 2c below.

Improved photoresist selectivity is shown by the vertical sidewalls and CD control of openings 260 and 270 in FIG. 2b. Due to the high aspect ratio of the present invention, opening 270 is formed deep enough to complete the contact with source region 211. Also because the present invention exhibits improved salicide etch selectivity, openings 260 and 270 do not punchthrough salicide layers 230. Due to the high aspect ratios and improved photoresist and salicide etch selectivity of the present invention the critical dimensions of openings 260 and 270 are controllable to submicron dimensions with good electrical reliability.

Figure 2C:
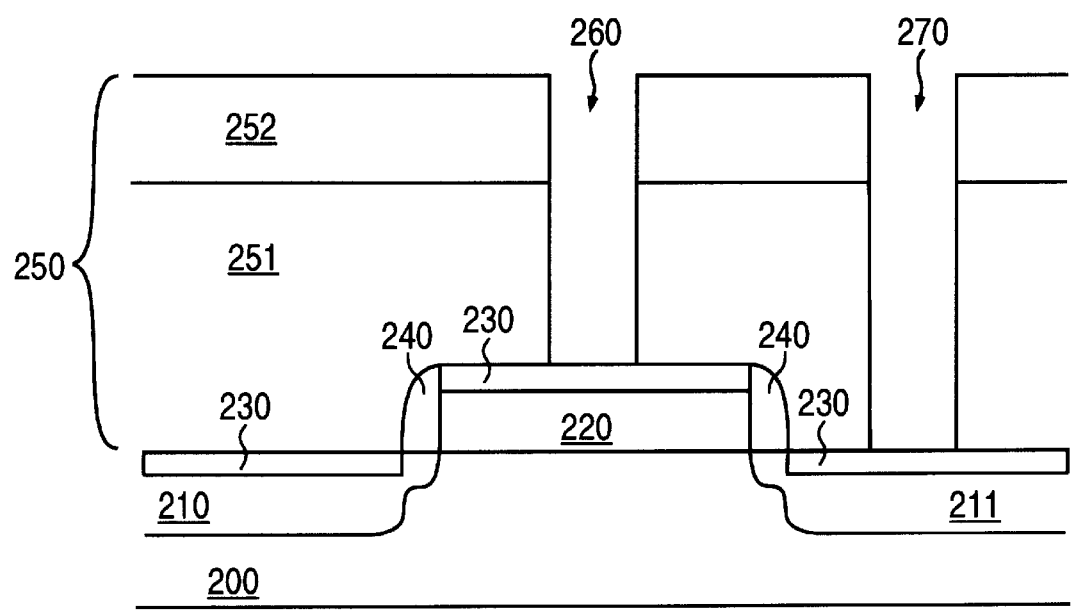
FIG. 2c illustrates a cross-sectional view of a contact formed with a gate electrode and source region of a semiconductor device using another preferred embodiment of the present invention.

FIG. 2c illustrates another embodiment of the semiconductor device shown in FIG. 2a wherein the contacts 260 and 270 have been formed using the etch process of another embodiment of the present invention. As shown in FIG. 2c oxide layer 250 is a dual oxide layer with a first oxide layer 251 formed of a doped oxide, for example BPTEOS, and a second oxide layer 252 formed of an undoped oxide, for example PTEOS. Because a dual oxide layer is used, two etch steps, one for undoped oxide layer 252 and another for doped oxide layer 251, are required. The first etch step, which etches undoped oxide layer 252 is performed with the etch recipe of the present invention, as described above, at a first etch rate of approximately 600–800 nm/min. In one currently preferred embodiment the undoped oxide layer is etched at a rate of approximately 700 nm/min. The second etch step, which etches doped oxide layer 251 is also performed using the etch recipe of the present invention, as described above, except at a second etch rate of approximately 850–1050 nm/min. In one currently preferred embodiment the doped oxide layer is etched at a rate of approximately 950 nm/min.

The present invention exhibits etch selectivity ratios (i.e. etch selectivity of the oxide layer: etch selectivity of the stopping layer) in the range of approximately >300:1 for oxide:salicide, oxide:polysilicon, and oxide:silicon and approximately $\geq$13:1 for oxide:photoresist. Additionally, the present invention exhibits aspect ratios of approximately $\geq$5:1 for oxide:polysilicon and oxide:salicide. Thus, the present invention has the ability to form submicron contacts, including dimensions $\leq$0.25 micron, with vertical sidewall profiles in the range of approximately 88–90°, thereby allowing increased chip/component densities. Also, due to the etch selectivity of the present invention, etch stops are not required when forming contacts utilizing the method of the present invention. An additional benefit of the present invention is that the etch recipe does not exhibit significant polymer deposition, therefore larger numbers of wafers may be etched before having to clean the reactor. This increases the throughput of the reactor as well as decreases the downtime and costs for maintaining the reactor.

Thus, a highly selective etch process for submicron contacts has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for forming contacts in a substrate comprising:
   forming a gate electrode above said substrate, where in said gate electrode comprises polysilicon;
   forming a source region and a drain region in said substrate;
   forming a salicide layer above said gate electrode, said source region, and said drain region;
   depositing a first oxide layer above said substrate;
   depositing a second oxide layer directly above said first oxide layer; and
   forming an opening in said first and second oxide layers, said opening having vertical sidewalls, wherein said step of forming said opening comprises the steps of:
   depositing a photoresist layer above said second oxide layer;
   patterning said photoresist layer;
   etching said first and second oxide layers, wherein said step of etching said first and second oxide layers is performed in a low density parallel plate etch reactor, wherein said first and second oxide layers are selectively etched to the surface of said salicide layer, and wherein said first and second oxide layers are etched at a pressure in the range of approximately 100–300 mTorr; and
   removing said photoresist layer.

2. The method as described in claim 1 wherein said first oxide layer is a doped oxide; and
   said second oxide layer is an undoped oxide.

3. The method as described in claim 2 wherein said step of etching said oxide layers comprises the steps of:
   a first etch step, wherein said second oxide layer is etched at a rate of approximately 600–800 nm/min; and
   a second etch step, wherein said first oxide layer is etched at a rate of approximately 850–1050 nm/min.

4. The method as described in claim 1 wherein said oxide layers are etched with a forward power of approximately 1000–1800 watts.

5. The method as described in claim 1 wherein said oxide layers are etched with a nitrogen gas and wherein said nitrogen gas has a flow in the range of approximately 20–100 sccm.

6. The method as described in claim 1 wherein said oxide layers are etched with a reflected power of less than 10 watts.

7. The method as described in claim 1 wherein said oxide layers are etched with:
   a frequency of approximately 400 kHz;
   a gap spacing in the range of approximately 1–1.2 cm;
   a $CHF_3:CF_4$ gas flow ratio in the range of approximately 3:1–1:1, respectively;
   an argon gas flow in the range of approximately 300–500 sccm;
   a helium backside cooling pressure in the range of approximately 10–20 Torr; and
   an electrode temperature in the range of approximately 0.1–20° C.

8. The method as described in claim 1 wherein the power of said reactor is split evenly between each electrode of said reactor and the RF power signal at each electrode is 180 degrees out of phase.

9. A method for forming contacts in a substrate with improved photoresist and salicide etch selectivity comprising:
   etching a first oxide layer and a second oxide layer of said substrate, wherein said second oxide layers directly above said first oxide layer, and wherein said step of etching said oxide layers is performed in a low density parallel plate etch reactor, wherein the power of said reactor is split evenly between each electrode of said reactor and the RF power signal at each electrode is 180 degrees out of phase, and wherein said oxide layers are etched with:
   a pressure in the range of approximately 100–300 mTorr;
   a forward power of approximately 1000–1800 Knotts;
   a nitrogen gas, wherein said nitrogen gas has a flow in the range of approximately 20–100 sccm;
   a reflected power of less than 10 watts;
   a frequency of approximately 400 kHz;
   a gap spacing in the range of approximately 1–1.2 cm,
   a $CHF_3:CF_4$ gas flow ratio in the range of approximately 3:1–1:1, respectively,
   an argon gas flow in the range of approximately 300–500 sccm;
   a helium backside cooling pressure in the range of approximately 10–20 Torr; and
   an electrode temperature in the range of approximately 0.1–20° C.

10. The method as described in claim 9 wherein said first oxide layer is a doped oxide; and said second oxide layer is an undoped oxide.

11. The method as described in claim 10 wherein said step of etching said oxide layers further comprises:
    a first etch step, wherein said second oxide layer is etched at a rate of approximately 600–800 nm/min; and
    a second etch step, wherein said first oxide layer is etched at a rate of approximately 850–1050 nm/min.

12. A method for forming contacts in a substrate comprising:
    depositing a first oxide layer above said substrate;
    depositing a second oxide layer directly above said first oxide layer; and
    etching said first and second oxide layers, wherein said step of etching said first and second oxide layers is performed in a low density parallel plate etch reactor, wherein said first and second oxide layers are selectively etched to the surface of said salicide layer, and wherein said first and second oxide layers are etched at a pressure in the range of approximately 100–300 mTorr.

13. The method as described in claim 12 wherein said first oxide layer is a doped oxide and said second oxide layer is an undoped oxide.

14. The method as described in claim 13 wherein said step of etching said oxide layers comprises the steps of:

a first etch step, wherein said second oxide layer is etched at a rate of approximately 600–800 nm/min; and a second etch step, wherein said first oxide layer is etched at a rate of approximately 850–1050 nm/min.

15. The method as described in claim 12 wherein said oxide layers are etched with a forward power of approximately 1000–1800 watts.

16. The method as described in claim 12 wherein said oxide layers are etched with a nitrogen gas and wherein said nitrogen gas has a flow in the range of approximately 20–100 sccm.

17. The method as described in claim 12 wherein said oxide layers are etched with a reflected power of less than 10 watts.

18. The method as described in claim 12 wherein said oxide layers are etched with:

a frequency of approximately 400 kHz;

a gap spacing in the range of approximately 1–1.2 cm;

a $CHF_3:CF_4$ gas flow ratio in the range of approximately 3:1–1:1, respectively;

an argon gas flow in the range of approximately 300–500 sccm;

a helium backside cooling pressure in the range of approximately 10–20 Torr; and an electrode temperature in the range of approximately 0.1–20° C.

19. The method as described in claim 12 wherein the power of said reactor is split evenly between each electrode of said reactor and the RF power signal at each electrode is 180 degrees out of phase.

* * * * *